US006106996A

United States Patent [19]

Van Damme et al.

[11] Patent Number: 6,106,996

[45] Date of Patent: Aug. 22, 2000

[54] HEAT SENSITIVE IMAGING ELEMENT AND A METHOD FOR PRODUCING LITHOGRAPHIC PLATES THEREWITH

[75] Inventors: Marc Van Damme, Heverlee; Joan Vermeersch, Deinze, both of Belgium

[73] Assignee: Agfa-Gevaert, N.V., Mortsel, Belgium

[21] Appl. No.: 09/073,435

[22] Filed: May 6, 1998

Related U.S. Application Data

[60] Provisional application No. 60/050,855, Jun. 26, 1997.

[30] Foreign Application Priority Data

May 27, 1997 [EP] European Pat. Off. .............. 97201559

[51] Int. Cl.[7] ...................................................... G03F 7/004

[52] U.S. Cl. ........................ 430/271.1; 430/926; 430/944

[58] Field of Search ............................. 430/271.1, 281.1, 430/282.1, 286.1, 926, 944, 302, 270.1

[56] References Cited

U.S. PATENT DOCUMENTS

| | | | |
|---|---|---|---|
| 3,679,410 | 7/1972 | Vrancken et al. . | |
| 5,811,215 | 9/1998 | Van Damme et al. | 430/201 |

FOREIGN PATENT DOCUMENTS

| | | |
|---|---|---|
| 0 678 380 A2 | 10/1995 | European Pat. Off. . |
| 0 678 380 A3 | 9/1996 | European Pat. Off. . |
| 1 208 415 | 10/1970 | United Kingdom . |

OTHER PUBLICATIONS

Patent Abstracts of Japan, vol. 010, No. 055 (M–458), Mar. 5, 1986, & JP 60 201987 A (Ricoh KK), Oct. 12, 1985.

*Primary Examiner*—Cynthia Hamilton
*Assistant Examiner*—Barbara Gilmore
*Attorney, Agent, or Firm*—Breiner & Breiner

[57] ABSTRACT

According to the present invention there is provided a heat-sensitive imaging element for making lithographic printing plates comprising a lithographic base having a hydrophilic surface, a hydrophobic first layer that is sensitive to heat including at least a hydrophobic polymer and a compound that is capable of converting light into heat, said layer having a decreased or increased capacity for being penetrated and/or solubilized by an aqueous developer upon exposure to actinic light, characterized in that said imaging element comprises a second layer located between the first layer and the hydrophilic surface and including a dispersed hydrophobic thermoplastic polymer latex, said second layer being soluble or dispersible in an aqueous solution.

12 Claims, No Drawings

HEAT SENSITIVE IMAGING ELEMENT AND A METHOD FOR PRODUCING LITHOGRAPHIC PLATES THEREWITH

This application claims the benefit of U.S. Provisional Application No. 60/050,855 filed Jun. 26, 1997.

DESCRIPTION

1. Field of the Invention

The present invention relates to a heat sensitive material for making a lithographic printing plate. The present invention further relates to a method for preparing a printing plate from said heat sensitive material.

2. Background of the Invention

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy ink in the photo-exposed (negative working) or in the non-exposed areas (positive working) on a hydrophilic background.

In the production of common lithographic plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon imagewise exposure of the light-sensitive layer the exposed image areas become insoluble and the unexposed areas remain soluble. The plate is then developed with a suitable liquid to remove the diazonium salt or diazo resin in the unexposed areas.

On the other hand, methods are known for making printing plates involving the use of imaging elements that are heat sensitive rather than photosensitive. A particular disadvantage of photosensitive imaging elements such as described above for making a printing plate is that they have to be shielded from the light. Furthermore they have a problem of sensitivity in view of the storage stability and they show a lower resolution. The trend towards heat sensitive printing plate precursors is clearly seen on the market.

For example, Research Disclosure no. 33303 of January 1992 discloses a heat sensitive imaging element comprising on a support a cross-linked hydrophilic layer containing thermoplastic polymer particles and an infrared absorbing pigment such as e.g. carbon black. By image-wise exposure to an infrared laser, the thermoplastic polymer particles are image-wise coagulated thereby rendering the surface of the imaging element at these areas ink acceptant without any further development. A disadvantage of this method is that the printing plate obtained is easily damaged since the non-printing areas may become ink accepting when some pressure is applied thereto. Moreover, under critical conditions, the lithographic performance of such a printing plate may be poor and accordingly such printing plate has little lithographic printing latitude.

EP-A-514145 discloses a heat sensitive imaging element including a coating comprising core-shell particles having a water insoluble heat softenable core component and a shell component which is soluble or swellable in aqueous alkaline medium. Red or infrared laser light directed image-wise at said imaging element causes selected particles to coalesce, at least partially, to form an image and the non-coalesced particles are then selectively removed by means of an aqueous alkaline developer. Afterwards a baking step is performed. However the printing endurance of a so obtained printing plate is low.

EP-A-599510 discloses a heat sensitive imaging element which comprises a substrate coated with (i) a layer which comprises (1) a disperse phase comprising a water-insoluble heat softenable component A and (2) a binder or continuous phase consisting of a component B which is soluble or swellable in aqueous, preferably aqueous alkaline medium, at least one of components A and B including a reactive group or precursor therefor, such that insolubilization of the layer occurs at elevated temperature and/or on exposure to actinic radiation, and (ii) a substance capable of strongly absorbing radiation and transferring the energy thus obtained as heat to the disperse phase so that at least partial coalescence of the coating occurs. After image-wise irradiation of the imaging element and developing the image-wise irradiated plate, said plate is heated and/or subjected to actinic irradiation to effect insolubilization. However the printing endurance of a so obtained printing plate is low.

EP-A-625728 discloses an imaging element comprising a layer which is sensitive to UV- and IR-irradiation and which can be positive or negative working. This layer comprises a resole resin, a novolac resin, a latent Bronsted acid and an IR-absorbing substance. The printing results of a lithographic plate obtained by irradiating and developing said imaging element are poor.

U.S. Pat. No. 5,340,699 is almost identical with EP-A-625728 but discloses the method for obtaining a negative working IR-laser recording imaging element. The IR-sensitive layer comprises a resole resin, a novolac resin, a latent Bronsted acid and an IR-absorbing substance. The printing results of a lithographic plate obtained by irradiating and developing said imaging element are poor.

U.S. Pat. No. 4,708,925 discloses a positive working imaging element including a photosensitive composition comprising an alkali-soluble novolac resin and an onium-salt. This composition can optionally contain an IR-sensitizer. After image-wise exposing said imaging element to UV—visible—or eventually IR-radiation followed by a development step with an aqueous alkali liquid there is obtained a positive working printing plate. The printing results of a lithographic plate obtained by irradiating and developing said imaging element are poor.

EP-A-678380 discloses a lithographic printing member directly imageable by laser discharge, the member comprising (a) an ink-accepting first layer, characterized by ablative absorption of imaging radiation; (b) a second layer underlying the first layer, the second layer being at least partially soluble in a cleaning solvent; and (c) a hydrophilic metal substrate. Said second layer consist of a hydrophilic binder, not of a dispersed hydrophobic thermoplastic polymer latex.

Ch 482551 discloses a thermosensitive recording material which comprises a support, a thermosensitive imaging layer which contains hydrophobic thermoplastic particles dispersed in a hydrophilic binder and that is coated on an intermediate layer comprising hydrophobic thermoplastic particles having a melting point or a softening point lower or practically equal to this of the hydrophobic thermoplastic particles present in the hydrophilic binder of the recording layer. Nowhere is disclosed that said intermediate layer is soluble or dispersible in an aqueous solution.

EP-A-96200972.6 discloses a heat sensitive imaging element comprising on a hydrophilic surface of a lithographic base an image forming layer comprising hydrophobic thermoplastic polymer particles dispersed in a water insoluble alkali soluble or swellable resin and a compound capable of converting light into heat, said compound being present in said image forming layer or a layer adjacent thereto, wherein said alkali swellable or soluble resin comprises phenolic hydroxy groups and/or carboxyl groups. All the disclosed systems either require a treatment after the development step and/or yield lithographic plates with poor printing properties. So, there is still a need for a heat sensitive imaging element that is easy to process and yields a lithographic plate with good or excellent printing properties.

Especially heat sensitive imaging elements whereof the heat sensitive layer is directly applied on the hydrophilic base are hard to process to hydrophilic plates where the heat sensitive layer is totally removed in the non-image areas so that there is ink uptake in the non-image areas.

SUMMARY OF THE INVENTION

It is an object of the invention to provide a heat-sensitive imaging element for making lithographic printing plates having excellent printing properties, especially no ink uptake in the non-image areas, developable in a convenient ecological way.

It is an object of the invention to provide a heat-sensitive imaging element for making lithographic printing plates having excellent printing properties developable in water.

It is further an object of the present invention to provide a heat-sensitive imaging element for making printing plates having a high infrared sensitivity.

Further objects of the present invention will become clear from the description hereinafter.

According to the present invention there is provided a heat-sensitive imaging element for making lithographic printing plates comprising a lithographic base having a hydrophilic surface, a hydrophobic first layer that is sensitive to heat including at least a hydrophobic polymer and a compound that is capable of converting light into heat, said layer having a decreased or increased capacity for being penetrated and/or solubilized by an aqueous developer upon exposure to actinic light, characterized in that said imaging element comprises a second layer located between the first layer and the hydrophilic surface and including a dispersed hydrophobic thermoplastic polymer latex, said second layer being soluble or dispersible in an aqueous solution.

According to the present invention there is also provided a method for obtaining lithographic printing plates comprising the steps of image-wise exposing to actinic light a heat-sensitive imaging element as described above and developing said exposed imaging element by means of an aqueous solution.

DETAILED DESCRIPTION OF THE INVENTION

It has been found that lithographic printing plates of high quality, giving prints without ink uptake in the non-image areas can be obtained according to the method of the present invention using an imaging element as described above. More precisely it has been found that said printing plates are of high quality and are provided in a convenient way, thereby offering economical and ecological advantages.

An imaging element for use in accordance with the present invention comprises on a hydrophilic surface of a lithographic base in the order given a second layer including a dispersed hydrophobic thermoplastic polymer latex, said second layer being soluble or dispersible in an aqueous solution and a hydrophobic first layer that is sensitive to heat having at least a hydrophobic polymer and a compound that is capable of converting light into heat, said layer having a decreased or increased capacity for being penetrated and/or solubilized by an aqueous developer upon exposure to actinic light.

Preferably, the second layer is contiguous to the first layer. Also preferably the first layer is an outermost layer.

According to the invention said second layer is preferably desensitized for visible and UV irradiation.

The hydrophobic thermoplastic polymer latex present in the second layer can be dispersed in a hydrophilic binder.

The second layer comprising a hydrophilic binder used in connection with the present invention is preferably not crosslinked or only slightly crosslinked. Suitable hydrophilic binders for use in said second layer in connection with this invention are water soluble (co)polymers for example synthetic homo- or copolymers such as polyvinylalcohol, a poly(meth)acrylic acid, a poly(meth)acrylamide, a polyhydroxyethyl(meth)acrylate, a polyvinylmethylether or natural binders such as gelatin, a polysaccharide such as e.g. dextran, pullulan, cellulose, arabic gum, alginic acid.

The hydrophilic binder can also be a water insoluble, alkali soluble or swellable resin having phenolic hydroxy groups and/or carboxyl groups.

Preferably the water insoluble, alkali soluble or swellable resin used in connection with the present invention comprises phenolic hydroxy groups. Suitable water insoluble, alkali soluble or swellable resins for use in an image-forming layer in connection with this invention are for example synthetic novolac resins such as ALNOVOL, a registered trade mark of Reichold Hoechst and DUREZ, a registered trade mark of OxyChem and synthetic polyvinylfenols such as MARUKA LYNCUR M, a registered trade mark of Dyno Cyanamid.

The hydrophobic thermoplastic polymer latex can also be dispersed in an aqueous medium without a binder.

The hydrophobic thermoplastic polymer latices used in connection with the present invention preferably have a coagulation temperature above 50° C. and more preferably above 70° C. Coagulation may result from softening or melting of the thermoplastic polymer latices under the influence of heat. There is no specific upper limit to the coagulation temperature of the thermoplastic hydrophobic polymer latices, however the temperature should be sufficiently below the decomposition temperature of the polymer latices. Preferably the coagulation temperature is at least 10° C. below the temperature at which the decomposition of the polymer latices occurs. When said polymer latices are subjected to a temperature above the coagulation temperature they coagulate to form a hydrophobic agglomerate so that at these parts the hydrophobic latices become insoluble in plain water or an aqueous liquid.

Specific examples of hydrophobic thermoplastic polymer latices for use in connection with the present invention with a Tg above 80° C. are preferably polyvinyl chloride, polyvinylidene chloride, polyacrylonitrile, polyvinyl carbazole etc., copolymers or mixtures thereof. Most preferably used are polystyrene, polymethylmethacrylate or copolymers thereof.

When the hydrophobic thermoplastic polymer latex is dispersed in an aqueous medium without a binder said hydrophobic thermoplastic polymer latex preferably contains a water dispersing functional group such as an acid function. Preferred hydrophobic thermoplastic polymer dispersed latices in such embodiment are polymers of therephthalic acid or isophthalic acid with ethylene diglycol or copolymers of therephthalic acid and isophthalic acid with ethylene diglycol, said polymers or copolymers comprising sulphoisophthalic acid in an amount between 0.5 and 5%.

The weight average molecular weight of the hydrophobic thermoplastic polymer may range from 5,000 to 1,000,000 g/mol.

The hydrophobic thermoplastic polymer latex may have a particle size from 0.01 $\mu$m to 50 $\mu$m, more preferably between 0.05 $\mu$m and 10 $\mu$m and most preferably between 0.05 $\mu$m and 2 $\mu$m.

The hydrophobic thermoplastic polymer latex is present as a dispersion in the aqueous coating liquid of the image forming layer and may be prepared by the methods disclosed in U.S. Pat. No. 3,476,937. Another method especially suitable for preparing an aqueous dispersion of the thermoplastic polymer latex comprises:

dissolving the hydrophobic thermoplastic polymer in an organic water immiscible solvent, dispersing the thus obtained solution in water or in an aqueous medium and removing the organic solvent by evaporation.

The amount of hydrophobic thermoplastic polymer latex contained in the image forming layer when said layer contains a hydrophilic binder is preferably between 20% by weight and 90% by weight and more preferably between 25% by weight and 85% by weight and most preferably between 30% by weight and 80% by weight.

The second layer if containing a hydrophilic binder can also comprise crosslinking agents although this is not necessary. Preferred crosslinking agents are low molecular weight substances comprising a methylol group such as for example melamine-formaldehyde resins, glycoluril-formaldehyde resins, thiourea-formaldehyde resins, guanamine-formaldehyde resins, benzoguanamine-formaldehyde resins. A number of said melamine-formaldehyde resins and glycoluril-formaldehyde resins are commercially available under the trade names of CYMEL (Dyno Cyanamid Co., Ltd.) and NIKALAC (Sanwa Chemical Co., Ltd.)

According to one embodiment of the present invention, the lithographic base having a hydrophilic surface can be an anodized aluminum. A particularly preferred lithographic base having a hydrophilic surface is an electrochemically grained and anodized aluminum support. According to the present invention, an anodized aluminum support may be treated to improve the hydrophilic properties of its surface. For example, the aluminum support may be silicated by treating its surface with sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or can be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde. It is further evident that one or more of these post treatments may be carried out alone or in combination.

According to another embodiment in connection with the present invention, the lithographic base having a hydrophilic surface comprises a flexible support, such as e.g. paper or plastic film, provided with a cross-linked hydrophilic layer. A particularly suitable cross-linked hydrophilic layer may be obtained from a hydrophilic binder cross-linked with a cross-linking agent such as formaldehyde, glyoxal, polyisocyanate or a hydrolyzed tetraalkylorthosilicate. The latter is particularly preferred.

As hydrophilic binder there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, preferably between 0.5 and 5 parts by weight, more preferably between 1.0 parts by weight and 3 parts by weight.

A cross-linked hydrophilic layer in a lithographic base used in accordance with the present embodiment preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas.

The thickness of a cross-linked hydrophilic layer in a lithographic base in accordance with this embodiment may vary in the range of 0.2 to 25 $\mu$m and is preferably 1 to 10 $\mu$m.

Particular examples of suitable cross-linked hydrophilic layers for use in accordance with the present invention are disclosed in EP-A 601240, GB-P-1419512, FR-P-2300354, U.S. Pat. No. 3,971,660, U.S. Pat. No. 4,284,705 and EP-A 514490.

As flexible support of a lithographic base in correction with the present embodiment it is particularly preferred to use a plastic film e.g. substrated polyethylene terephthalate film, cellulose acetate film, polystyrene film, polycarbonate film etc . . . . The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A 619524, EP-A 620502 and EP-A 619525. Preferably, the amount of silica in the adhesion improving layer is between 200 mg per $m^2$ and 750 mg per $m^2$. Further, the ratio of silica to hydrophilic binder is preferably more than 1 and the surface area of the colloidal silica is preferably at least 300 $m^2$ per gram, more preferably at least 500 $m^2$ per gram.

An imaging element for use in accordance with the present invention comprises a hydrophobic first layer that is sensitive to heat having at least a hydrophobic polymer and a compound that is capable of converting light into heat, said layer having a decreased or increased capacity for being penetrated and/or solubilised by an aqueous developer upon exposure to actinic light.

The first layer includes a compound capable of converting light to heat. Suitable compounds capable of converting light into heat are preferably infrared absorbing components although the wavelength of absorption is not of particular importance as long as the absorption of the compound used is in the wavelength range of the light source used for image-wise exposure. Particularly useful compounds are for example dyes and in particular infrared dyes, carbon black, metal carbides, borides, nitrides, carbonitrides, bronze-structured oxides and oxides structurally related to the bronze family but lacking the A component e.g. $WO_{2.9}$. It is also possible to use conductive polymer dispersion such as polypyrrole or polyaniline-based conductive polymer dispersions. The lithographic performance and in particular the print endurance obtained depends on the heat-sensitivity of the imaging element. In this respect it has been found that carbon black yields very good and favorable results.

As a binder resin cellulose esters e.g. cellulose acetate, a copolymer of vinylidene chloride and acrylonitrile, poly (meth)acrylates, polyvinyl chloride, silicone resins etc. can be used. Preferred as binder resin is nitrocellulose.

In the first layer a difference in the capacity of being penetrated and/or solubilised by the aqueous alkaline solution is generated upon image-wise exposure. A difference in the capacity of the first layer to be penetrated and/or solubilized by a developing solution can be obtained by a thermally induced physical or chemical transformation. Examples of thermally induced physical transformations which generate a difference in said capacity are: laser induced coalescence of hydrophobic polymer particles in a hydrophilic binder as described in EP-A 952022871.0, 952022872.8, 952022873.6 and 952022874.4, which creates a reduction in the capacity of being penetrated and/or solubilized in the exposed areas and laser induced removal of material which creates an increase in the capacity in the exposed areas of the layer for penetration and/or solubilisation by the developing solution. Examples of thermally induced chemical transformations which generate a difference in the capacity of the layer for penetration and/or solubilization by a developer are: laser induced change in polarity which increases the said capacity in the exposed areas and laser induced crosslinking which reduces the said capacity in the exposed areas. The change in said capacity created upon laser exposure, should be high enough to allow a complete clean-out without damaging and/or solubilizing the resulting image upon development with an aqueous solution.

In the case that the said capacity is increased upon image-wise laser exposure, the imaged parts will be cleaned out during development without solubilizing and/or damaging the non-imaged parts.

In the case that the said capacity is decreased upon image-wise laser exposure, the non-imaged parts will be cleaned out during development without solubilizing and/or damaging the imaged parts.

Preferred in the present invention is a heat sensitive element, wherein the increased capacity of the first layer to be penetrated and/or solubilized by a developing solution on exposure to actinic radiation is due to a selective ablative absorption of the first layer in the imaging areas.

In order to obtain a lithographic plate the heat sensitive element according to the invention is first image-wise exposed to actinic light and then developed in an aqueous solution.

Actinic light is light that is absorbed by the compound converting light into heat.

Image-wise exposure in connection with the present invention is preferably an image-wise scanning exposure involving the use of a laser or L.E.D. It is highly preferred in connection with the present invention to use a laser emitting in the infrared (IR) and/or near-infrared, i.e. emitting in the wavelength range 700–1500 nm. Particularly preferred for use in connection with the present invention are laser diodes emitting in the near-infrared.

The development with the aqueous solution is preferably done within an interval of 5 to 120 seconds. The aqueous solution has an alkaline pH when the hydrophilic binder of the second layer is a water insoluble, alkali soluble or swellable resin. The aqueous solution has a neutral or an alkaline pH when the hydrophilic binder of the second layer is a water soluble resin. More preferably in this case water such as tap water is used.

Thus the imaged parts of the first layer that were rendered more penetrable for the aqueous alkaline solution upon exposure and the parts of the underlying layer are cleaned-out whereby a positive working printing plate is obtained. To obtain a negative working printing plate, the laser imaged parts of the layer are rendered less penetrable for the aqueous alkaline solution upon image-wise exposure, thus the non-imaged parts of the top layer and the parts of the underlying layer are cleaned out.

According to another embodiment of the method in accordance with the present invention, the imaging element is first mounted on the printing cylinder of the printing press and then image-wise exposed directly on the press. Subsequent to exposure, the imaging element can be developed as described above.

The printing plate of the present invention can also be used in the printing process as a seamless sleeve printing plate. In this option the printing plate is soldered in a cylindrical form by means of a laser. This cylindrical printing plate which has as diameter the diameter of the print cylinder is slided on the print cylinder instead of applying in a classical way a classically formed printing plate. More details on sleeves are given in "Grafisch Nieuws" ed. Keesing, 15, 1995, page 4 to 6.

In addition to the IR-sensitive compound the first layer may comprise a compound sensitive to visible light and/or UV-radiation to sensitise this layer to visible light and/or UV-radiation.

After the development of an image-wise exposed imaging element with an aqueous solution and drying the obtained plate can be used as a printing plate as such. However it is preferred to treat said plate with a gumming solution. A gumming solution contains a water soluble (co)polymers for example synthetic homo- or copolymers such as polyvinylalcohol, a poly(meth)acrylic acid, a poly(meth) acrylamide, a polyhydroxyethyl(meth)acrylate, a polyvinylmethylether or natural binders such as gelatin, a polysaccharide such as e.g. dextran, pullulan, cellulose, arabic gum, alginic acid. e.g. However, it is also possible to bake a gummed or ungummed developed plate at a temperature between 100° C. and 230° C. for a period of 40 minutes to 5 minutes. For example the exposed and developed plates can be baked at a temperature of 230° C. for 5 minutes, at a temperature of 150° C. for 10 minutes or at a temperature of 120° C. for 30 minutes.

The following examples illustrate the present invention without limiting it thereto. All parts are by weight unless otherwise specified.

EXAMPLE 1

Preparation of the Lithographic Base

A 0.20 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 $A/m^2$ to form a surface topography with an average center-line roughness Ra of 0.5 $\mu$m.

After rinsing with demineralized water the aluminum foil was then etched with an aqueous solution containing 300 g/l of sulfuric acid at 60° C. for 180 seconds and rinsed with demineralized water at 25° C. for 30 seconds.

The foil was subsequently subjected to anodic oxidation in an aqueous solution containing 200 g/l of sulfuric acid at a temperature of 45° C., a voltage of about 10 V and a current density of 150 $A/m^2$ for about 300 seconds to form an anodic oxidation film of 3.00 $g/m^2$ of $Al_2O_3$, then washed with demineralized water, posttreated with a solution containing polyvinylphosphonic acid (2.2 $g/m^2$).

Preparation of the Imaging Element

An imaging element according to the invention was prepared by first coating on the lithographic base from an aqueous medium a layer composed of 74.6% PMMA-latex, particle size 320 nm stabilised with Hostapal B, 18.7% polyvinylpyrrolidone, 1.1% polyvinylalcohol and 5.6% of a Cu-phthalocyanine pigment dispersion in a dry thickness of 1 $g/m^2$. Thereon is coated a layer comprising 49.4% of a Carbon Black dispersion, 36.4% nitrocellulose, 1% Solsperse 5000, 5% Solsperse 28000, 6.8% Cymel 301 and 1.4% p-Toluenesulphonic acid at a dry thickness of 1.5 $g/m^2$.

In a comparative example a material was prepared, without second layer; the to player being directly coated onto the lithographic base.

The obtained elements were heated for 2 days at 57° C. and 34% relative humidity, to assure a good physical and chemical stability of the top layer.

Both materials were imaged with an external drum IR-laser imaging apparatus (NdYLF laser 1060 nm, drum-speed 8 m/s, at adressabilities 5000 dpi and 200 dpi, power level in image plane 345 mW, spot size 10 $\mu$m), and develped in tap water (handdevelopment) and said plate was subsequently baked for 2 minutes at 200° C.

With the material having no second layer no selective clean-out could be obtained:

Optical density (Macbeth RD918-SB/Black filter)
exposed parts: 1.2
non-exposed parts: 1.3

With the material having a second layer a selective clean-out could be obtained, with full clean-out in the imaged parts:

Optical density (Macbeth RD918-SB/Black filter)
exposed parts: 0.00
non-exposed parts: 1.2

This plate was used for printing on an Heidelberg GTO printing machine with a conventional ink (ABDick 1020) and fountain solution (Rotamatic), resulting in good prints, i.e. no ink uptake in the exposed parts and good ink-uptake in the non-exposed parts.

EXAMPLE 2

Preparation of the Imaging Elements

An imaging element according to the invention was produced by preparing the following coating composition and coating it to an hydrophilic aluminum base in an amount of 30 $g/m^2$ (wet coating amount) and drying it at 40° C.

Preparation of the Coating Composition

To 140 g of a 20% dispersion of polymethylmethacrylate polymer (particle diameter of 320 nm) stabilized with Hostapal B (available from Hoechst) in deionized water was subsequently added, while stirring, 707 g of deionized water, 133 g of a 5% solution of polyvinylpyrrolidone (LUVISKOL K90 available from BASF) in water and 20 g of a dispersion containing 2% of polyvinyl alcohol and 10% of a dye (Heliogenblau D7565 available from BASF) stabilized with Ultravon W (available from Ciba-Geigy) in deionized water.

Preparation of the Heat-sensitive Layer

A heat-sensitive layer according to the invention was produced by preparing the following coating composition and coating it to the above described layer in an amount of 50 $g/m^2$ (wet coating amount) and drying it at 40° C.

Preparation of the Heat-sensitive Coating Composition

To 176 g of dispersion containing 12.5 wt % of Spezialschwarz 250 (available from Degussa), 1.25 wt % of Nitrocellulose E950 (available from Wolff Walsrode AG), 0.25 wt % of Solsperse 5000 (available from Zeneca Resins BV) and 1.25 wt % of Solsperse 28000 (available from Zeneca Resins BV) in etylacatate were subsequently added, while stirring, 135.8 g of a 10 wt % solution of Nitrocellulose E950 (available from Wolff Walsrode AG) in ethylacetate, 476 g of ethylacetate, 507 g of butylacetate, 15.0 g of a 20 wt % solution of CYMEL 301 (available from Dyno Cyanamid) in ethylacetate and 5.84 g of a 10 wt % solution of p-toluenesulfonic acid in ethylacetate.

Preparation of a Printing Plate and Making Copies of the Original

The above described imaging element was imaged (exposed) by means of a NdYLF laser (1064 nm/External Drum/4.4 m/s/plane energy 345 mW) and hereafter the exposed parts are washed-off manually with water. The printing plate was then heated for 2 minutes at 200° C.

Printing was carried out on a GTO46 offset press equipped with a Heidelberg™ semi-film dampening system. As ink, ABDICK 1020™ and as dampening liquid Rotamatic commercially available from Unigrafica Gmbh were used.

Prints were obtained without any ink uptake in the exposed areas.

EXAMPLE 3

Preparation of the Imaging Elements

An imaging element according to the invention was produced by preparing the following coating composition and coating it to an hydrophilic aluminum base in an amount of 30 g/m$^2$ (wet coating amount) and drying it at 40° C.

Preparation of the Coating Composition

To 200 g of a 10% dispersion of polystyrene polymer (particle diameter of 114 nm) stabilized with Mersolat K30 (available from Bayer) in deionized water was subsequently added, while stirring, 514 g of deionized water, 266 g of a 5% solution of polyvinylpyrrolidone (LUVISKOL K90 available from BASF) in water and 20 g of a dispersion containing 2% of polyvinyl alcohol and 10% of a dye (Heliogenblau D7565 available from BASF) stabilized with Ultravon W (available from Ciba-Geigy) in deionized water.

Preparation of the Heat-sensitive Layer

A heat-sensitive layer according to the invention was produced by preparing the following coating composition and coating it to the above described layer in an amount of 50 g/m$^2$ (wet coating amount) and drying it at 40° C.

Preparation of the Heat-sensitive Coating Composition

To 240 g of dispersion containing 12.5 wt % of Spezialschwarz 250 (available from Degussa), 1.25 wt % of Nitrocellulose E950 (available from Wolff Walsrode AG), 0.25 wt % of Solsperse 5000 (available from Zeneca Resins BV) and 1.25 wt % of Solsperse 28000 (available from Zeneca Resins BV) in etylacatate were subsequently added, while stirring, 114 g of a 10 wt % solution of Nitrocellulose E950 (available from Wolff Walsrode AG) in ethylacetate, 728 g of ethylacetate, 699 g of butylacetate, 13.0 g of a 20 wt % solution of CYMEL 301 (available from Dyno Cyanamid) in ethylacetate and 5.0 g of a 10 wt % solution of p-toluenesulfonic acid in ethylacetate.

Preparation of a Printing Plate and Making Copies of the Original

The above described imaging element was imaged (exposed) by means of a NdYLF laser (1064 nm/External Drum/4.4 m/s/plane energy 345 mW) and hereafter the exposed parts are washed-off manually with water. The printing plate was then heated for 2 minutes at 230° C.

Printing was carried out on a Rotaprint R35 offset press equipped with a dampening system. As ink, Van Son RB2329™ and as dampening liquid Rotamatic commercially available from Unigrafica Gmbh were used.

Prints were obtained without any ink uptake in the exposed areas.

EXAMPLE 4

Preparation of the Imaging Elements

An imaging element according to the invention was produced by preparing the following coating composition and coating it to an hydrophilic aluminum base in an amount of 30 g/m$^2$ (wet coating amount) and drying it at 40° C.

Preparation of the Coating Composition

To 77.5 g of a 24% dispersion of polymethylmethacrylate polymer (particle diameter of 1 micron) stabilized with Hostapal W (available from Hoechst) in deionized water was subsequently added, while stirring, 722.5 g of deionized water, 180 g of a 5% solution of polyvinylpyrrolidone (LUVISKOL K90 available from BASF) in water and 20 g of a dispersion containing 2% of polyvinyl alcohol and 10% of a dye (Heliogenblau D7565 available from BASF) stabilized with Ultravon W (available from Ciba-Geigy) in deionized water.

Preparation of the Heat-sensitive Layer

A heat-sensitive layer according to the invention was produced by preparing the following coating composition and coating it to the above described layer in an amount of 50 g/m$^2$ (wet coating amount) and drying it at 40° C.

Preparation of the Heat-sensitive Coating Composition

To 240 g of dispersion containing 12.5 wt % of Spezialschwarz 250 (available from Degussa), 1.25 wt % of Nitrocellulose E950 (available from Wolff Walsrode AG), 0.25 wt % of Solsperse 5000 (available from Zeneca Resins BV) and 1.25 wt % of Solsperse 28000 (available from Zeneca Resins BV) in etylacatate were subsequently added, while stirring, 114 g of a 10 wt % solution of Nitrocellulose E950 (available from Wolff Walsrode AG) in ethylacetate, 728 g of ethylacetate, 699 g of butylacetate, 13.0 g of a 20 wt % solution of CYMEL 301 (available from Dyno Cyanamid) in ethylacetate and 5.0 g of a 10 wt % solution of p-toluenesulfonic acid in ethylacetate.

Preparation of a Printing Plate and Making Copies of the Original

The above described imaging element was imaged (exposed) by means of a NdYLF laser (1064 nm/External Drum/4.4 m/s/plane energy 345 mW) and hereafter the exposed parts are washed-off manually with water. The printing plate was then heated for 5 minutes at 230° C.

Printing was carried out on a GTO46 offset press equipped with a Heidelberg™ semi-film dampening system. As ink, ABDICK 1020™ and as dampening liquid Rotamatic commercially available from Unigrafica Gmbh were used.

Prints were obtained without any ink uptake in the exposed areas.

What is claimed is:

1. A heat-sensitive imaging element for making positive lithographic printing plates comprising a lithographic base having a hydrophilic surface, a hydrophobic first layer that is sensitive to heat including at least a hydrophobic polymer and a compound that is capable of converting light into heat, said layer having an increased capacity for being penetrated and/or solubilized by an aqueous developer upon exposure to actinic light, wherein said imaging element comprises a second layer located between the first layer and the hydrophilic surface and including a dispersed hydrophobic thermoplastic polymer latex, said second layer being soluble or dispersible in an aqueous solution.

2. A heat sensitive imaging element according to claim 1 wherein said second layer is desensitized for visible and UV irradiation.

3. A heat sensitive imaging element according to claim 1 wherein said hydrophobic thermoplastic polymer latex present in the second layer is dispersed in a hydrophilic binder.

4. A heat sensitive imaging element according to claim 3 wherein said hydrophobic thermoplastic polymer latex present in the second layer is dispersed in a water soluble hydrophilic binder.

5. A heat sensitive imaging element according to claim 1 wherein said hydrophobic thermoplastic polymer latex present in the second layer is dispersed without a binder.

6. A heat sensitive imaging element according to claim 5 wherein said hydrophobic thermoplastic polymer latex present in the second layer contains a water dispersing functional group.

7. A heat sensitive imaging element according to claim 1 wherein said compound capable of converting light into heat is an infrared absorbing component.

8. A heat sensitive imaging element according to claim 1 wherein said hydrophobic polymer present in the first layer is nitrocellulose.

9. A method for obtaining lithographic printing plates comprising the steps of image-wise exposing to actinic light a heat-sensitive imaging element according to claim 1 and developing said exposed imaging element by means of an aqueous solution.

10. A method for obtaining lithographic printing plates comprising the steps of image-wise exposing to actinic light a heat-sensitive imaging element according to claim 4 and developing said exposed imaging element by means of water.

11. A method for obtaining lithographic printing plates according to claim 9 wherein after said developing step with water or an aqueous solution the heat sensitive imaging element is baked.

12. A method for obtaining lithographic printing plates according to claim 9 wherein inbetween said developing step with water or an aqueous solution and said baking step the heat sensitive imaging element is treated with a gumming solution.

* * * * *